(12) United States Patent
Haba et al.

(10) Patent No.: US 7,901,989 B2
(45) Date of Patent: Mar. 8, 2011

(54) RECONSTITUTED WAFER LEVEL STACKING

(75) Inventors: Belgacem Haba, Saratoga, CA (US); Ilyas Mohammed, Santa Clara, CA (US); Vage Oganesian, Palo Alto, CA (US); David Ovrutsky, Charlotte, NC (US); Laura Wills Mirkarimi, Sunol, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 12/143,743

(22) Filed: Jun. 20, 2008

(65) Prior Publication Data

US 2009/0160065 A1    Jun. 25, 2009

Related U.S. Application Data

(63) Continuation-in-part of application No. 11/787,209, filed on Apr. 13, 2007, which is a continuation-in-part of application No. 11/704,713, filed on Feb. 9, 2007.

(60) Provisional application No. 60/936,617, filed on Jun. 20, 2007, provisional application No. 60/850,850, filed on Oct. 10, 2006.

(51) Int. Cl.
*H01L 21/00* (2006.01)

(52) U.S. Cl. .................................. 438/110; 257/E23.178

(58) Field of Classification Search .................. 438/109, 438/110, 113; 257/E23.178
See application file for complete search history.

(56) References Cited

U.S. PATENT DOCUMENTS

| | | |
|---|---|---|
| 4,074,342 A | 2/1978 | Honn et al. |
| 4,500,905 A | 2/1985 | Shibata |
| 4,765,864 A | 8/1988 | Holland et al. |
| 4,842,699 A | 6/1989 | Hua et al. |
| 4,897,708 A | 1/1990 | Clements |

(Continued)

FOREIGN PATENT DOCUMENTS

DE    102004039906    8/2005

(Continued)

OTHER PUBLICATIONS

U.S. Appl. No. 60/936,617, filed Jun. 20, 2007.

(Continued)

*Primary Examiner* — David A Zarneke
*Assistant Examiner* — Jenny L Wagner
(74) *Attorney, Agent, or Firm* — Lerner, David, Littenberg, Krumholz & Mentlik, LLP

(57) ABSTRACT

A stacked microelectronic assembly is fabricated from a structure which includes a plurality of first microelectronic elements having front faces bonded to a carrier. Each first microelectronic element may have a first edge and a plurality of first traces extending along the front face towards the first edge. After exposing at least a portion of the first traces, a dielectric layer is formed over the plurality of first microelectronic elements. After thinning the dielectric layer, a plurality of second microelectronic elements are aligned and joined with the structure such that front faces of the second microelectronic elements are facing the rear faces of the plurality of first microelectronic elements. Processing is repeated to form the desirable number of layers of microelectronic elements. In one embodiment, the stacked layers of microelectronic elements may be notched at dicing lines to expose edges of traces, which may then be electrically connected to leads formed in the notches. Individual stacked microelectronic units may be separated from the stacked microelectronic assembly by any suitable dicing, sawing or breaking technique.

16 Claims, 11 Drawing Sheets

U.S. PATENT DOCUMENTS

| | | | |
|---|---|---|---|
| 4,954,875 A | 9/1990 | Clements | |
| 5,322,816 A | 6/1994 | Pinter | |
| 5,343,071 A | 8/1994 | Kazior et al. | |
| 5,412,539 A | 5/1995 | Elwell et al. | |
| 5,424,245 A | 6/1995 | Gurtler et al. | |
| 5,426,072 A | 6/1995 | Finnila | |
| 5,466,634 A | 11/1995 | Beilstein, Jr. et al. | |
| 5,563,084 A | 10/1996 | Ramm et al. | |
| 5,571,754 A | 11/1996 | Bertin et al. | |
| 5,604,673 A | 2/1997 | Washburn et al. | |
| 5,608,264 A | 3/1997 | Gaul | |
| 5,618,752 A | 4/1997 | Gaul | |
| 5,646,067 A | 7/1997 | Gaul | |
| 5,661,087 A | 8/1997 | Pedersen et al. | |
| 5,682,062 A | 10/1997 | Gaul | |
| 5,716,759 A | 2/1998 | Badehi et al. | |
| 5,766,984 A | 6/1998 | Ramm et al. | |
| 5,767,001 A | 6/1998 | Bertagnolli et al. | |
| 5,804,004 A | 9/1998 | Tuckerman et al. | |
| 5,814,889 A | 9/1998 | Gaul | |
| 5,817,530 A | 10/1998 | Ball | |
| 5,880,010 A | 3/1999 | Davidson | |
| 5,915,167 A | 6/1999 | Leedy | |
| 5,946,545 A | 8/1999 | Bertin et al. | |
| 5,973,386 A | 10/1999 | Horikawa | |
| 6,022,758 A | 2/2000 | Badehi et al. | |
| 6,031,274 A | 2/2000 | Muramatsu et al. | |
| 6,040,235 A * | 3/2000 | Badehi | 438/464 |
| 6,103,552 A | 8/2000 | Lin | |
| 6,130,823 A | 10/2000 | Lauder et al. | |
| 6,133,640 A | 10/2000 | Leedy | |
| 6,177,707 B1 | 1/2001 | Dekker et al. | |
| 6,188,129 B1 | 2/2001 | Paik et al. | |
| 6,204,562 B1 | 3/2001 | Ho et al. | |
| 6,208,545 B1 | 3/2001 | Leedy | |
| 6,261,865 B1 | 7/2001 | Akram | |
| 6,277,669 B1 | 8/2001 | Kung et al. | |
| 6,344,401 B1 | 2/2002 | Lam | |
| 6,396,710 B1 | 5/2002 | Iwami et al. | |
| 6,472,247 B1 | 10/2002 | Andoh et al. | |
| 6,472,293 B1 | 10/2002 | Suga | |
| 6,492,201 B1 | 12/2002 | Haba | |
| 6,498,381 B2 | 12/2002 | Halahan et al. | |
| 6,498,387 B1 | 12/2002 | Yang | |
| 6,548,391 B1 | 4/2003 | Ramm et al. | |
| 6,551,857 B2 | 4/2003 | Leedy | |
| 6,563,224 B2 | 5/2003 | Leedy | |
| 6,582,991 B1 | 6/2003 | Maeda et al. | |
| 6,607,938 B2 | 8/2003 | Kwon et al. | |
| 6,608,377 B2 | 8/2003 | Chang et al. | |
| 6,611,052 B2 | 8/2003 | Poo et al. | |
| 6,632,706 B1 | 10/2003 | Leedy | |
| 6,646,289 B1 | 11/2003 | Badehi et al. | |
| 6,656,827 B1 | 12/2003 | Tsao et al. | |
| 6,693,358 B2 | 2/2004 | Yamada et al. | |
| 6,717,254 B2 | 4/2004 | Siniaguine | |
| 6,727,576 B2 | 4/2004 | Hedler et al. | |
| 6,737,300 B2 | 5/2004 | Ding et al. | |
| 6,743,660 B2 | 6/2004 | Lee et al. | |
| 6,753,205 B2 | 6/2004 | Halahan | |
| 6,777,767 B2 | 8/2004 | Badehi et al. | |
| 6,806,559 B2 | 10/2004 | Gann et al. | |
| 6,828,175 B2 | 12/2004 | Wood et al. | |
| 6,844,241 B2 | 1/2005 | Halahan et al. | |
| 6,844,619 B2 | 1/2005 | Tago | |
| 6,864,172 B2 | 3/2005 | Noma et al. | |
| 6,867,123 B2 | 3/2005 | Katagiri et al. | |
| 6,878,608 B2 * | 4/2005 | Brofman et al. | 438/459 |
| 6,897,148 B2 | 5/2005 | Halahan et al. | |
| 6,958,285 B2 | 10/2005 | Siniaguine | |
| 6,972,480 B2 | 12/2005 | Zilber et al. | |
| 6,972,483 B1 | 12/2005 | Song | |
| 6,982,475 B1 | 1/2006 | MacIntyre | |
| 6,984,545 B2 | 1/2006 | Grigg et al. | |
| 7,001,825 B2 | 2/2006 | Halahan et al. | |
| 7,034,401 B2 | 4/2006 | Savastiouk et al. | |
| 7,049,170 B2 | 5/2006 | Savastiouk et al. | |
| 7,060,601 B2 | 6/2006 | Savastiouk et al. | |
| 7,138,295 B2 | 11/2006 | Leedy | |
| 7,160,753 B2 | 1/2007 | Williams, Jr. | |
| 7,186,586 B2 | 3/2007 | Savastiouk et al. | |
| 7,192,796 B2 | 3/2007 | Zilber et al. | |
| 7,193,239 B2 | 3/2007 | Leedy | |
| 7,215,018 B2 | 5/2007 | Vindasius et al. | |
| 7,241,641 B2 | 7/2007 | Savastiouk et al. | |
| 7,241,675 B2 | 7/2007 | Savastiouk et al. | |
| 7,285,865 B2 | 10/2007 | Kwon et al. | |
| 7,474,004 B2 | 1/2009 | Leedy | |
| 7,495,316 B2 | 2/2009 | Kirby et al. | |
| 7,504,732 B2 | 3/2009 | Leedy | |
| 7,510,928 B2 | 3/2009 | Savastiouk et al. | |
| 7,521,360 B2 | 4/2009 | Halahan et al. | |
| 7,662,710 B2 | 2/2010 | Shiv | |
| 7,705,466 B2 | 4/2010 | Leedy | |
| 2002/0047199 A1 | 4/2002 | Ohuchi et al. | |
| 2002/0109236 A1 | 8/2002 | Kim et al. | |
| 2002/0127775 A1 | 9/2002 | Haba et al. | |
| 2002/0132465 A1 | 9/2002 | Leedy | |
| 2002/0171145 A1 | 11/2002 | Higuchi et al. | |
| 2003/0094683 A1 | 5/2003 | Poo et al. | |
| 2003/0173608 A1 | 9/2003 | Leedy | |
| 2003/0209772 A1 | 11/2003 | Prabhu | |
| 2003/0233704 A1 | 12/2003 | Castellote | |
| 2004/0016942 A1 | 1/2004 | Miyazawa et al. | |
| 2004/0070063 A1 | 4/2004 | Leedy | |
| 2004/0082114 A1 | 4/2004 | Horng | |
| 2004/0104454 A1 | 6/2004 | Takaoka et al. | |
| 2004/0142509 A1 | 7/2004 | Imai | |
| 2004/0155354 A1 | 8/2004 | Hanaoka et al. | |
| 2004/0169278 A1 | 9/2004 | Kinsman | |
| 2004/0222508 A1 | 11/2004 | Aoyagi | |
| 2004/0251525 A1 | 12/2004 | Zilber et al. | |
| 2005/0012225 A1 | 1/2005 | Choi et al. | |
| 2005/0046002 A1 | 3/2005 | Lee et al. | |
| 2005/0056903 A1 | 3/2005 | Yamamoto et al. | |
| 2005/0067680 A1 | 3/2005 | Boon et al. | |
| 2005/0073035 A1 | 4/2005 | Moxham | |
| 2005/0095835 A1 | 5/2005 | Humpston et al. | |
| 2005/0156330 A1 | 7/2005 | Harris | |
| 2005/0260794 A1 | 11/2005 | Lo et al. | |
| 2005/0263866 A1 | 12/2005 | Wan | |
| 2005/0287783 A1 | 12/2005 | Kirby et al. | |
| 2006/0006488 A1 | 1/2006 | Kanbe | |
| 2006/0017161 A1 | 1/2006 | Chung et al. | |
| 2006/0043556 A1 | 3/2006 | Su et al. | |
| 2006/0043598 A1 | 3/2006 | Kirby et al. | |
| 2006/0043601 A1 | 3/2006 | Pahl | |
| 2006/0046348 A1 | 3/2006 | Kang | |
| 2006/0046471 A1 | 3/2006 | Kirby et al. | |
| 2006/0055061 A1 | 3/2006 | Hosokawa et al. | |
| 2006/0068580 A1 | 3/2006 | Dotta | |
| 2006/0076670 A1 | 4/2006 | Lim et al. | |
| 2006/0079019 A1 | 4/2006 | Kim | |
| 2006/0094165 A1 | 5/2006 | Hedler et al. | |
| 2006/0115932 A1 | 6/2006 | Farnworth et al. | |
| 2006/0138626 A1 | 6/2006 | Liew et al. | |
| 2006/0175697 A1 | 8/2006 | Kurosawa et al. | |
| 2006/0220234 A1 | 10/2006 | Honer et al. | |
| 2006/0220262 A1 | 10/2006 | Meyer et al. | |
| 2006/0292866 A1 | 12/2006 | Borwick et al. | |
| 2007/0007556 A1 | 1/2007 | Shibayama | |
| 2007/0035001 A1 | 2/2007 | Kuhmann et al. | |
| 2007/0045803 A1 | 3/2007 | Ye et al. | |
| 2007/0052050 A1 | 3/2007 | Dierickx | |
| 2007/0102802 A1 | 5/2007 | Kang et al. | |
| 2007/0126085 A1 | 6/2007 | Kawano et al. | |
| 2007/0132082 A1 | 6/2007 | Tang et al. | |
| 2007/0148941 A1 | 6/2007 | Haba et al. | |
| 2007/0158807 A1 | 7/2007 | Lu et al. | |
| 2007/0181989 A1 | 8/2007 | Corisis et al. | |
| 2007/0190747 A1 | 8/2007 | Humpston et al. | |
| 2007/0249095 A1 | 10/2007 | Song et al. | |
| 2008/0083976 A1 | 4/2008 | Haba et al. | |
| 2008/0083977 A1 | 4/2008 | Haba et al. | |
| 2008/0090333 A1 | 4/2008 | Haba et al. | |
| 2008/0099900 A1 | 5/2008 | Oganesian et al. | |
| 2008/0116544 A1 | 5/2008 | Grinman et al. | |

| | | | |
|---|---|---|---|
| 2008/0116545 A1 | 5/2008 | Grinman et al. | |
| 2008/0246136 A1 | 10/2008 | Haba et al. | |
| 2008/0284041 A1 | 11/2008 | Jang et al. | |
| 2008/0315407 A1 | 12/2008 | Andrews, Jr. et al. | |
| 2009/0032966 A1 | 2/2009 | Lee et al. | |
| 2009/0039528 A1 | 2/2009 | Haba et al. | |
| 2009/0065907 A1 | 3/2009 | Haba et al. | |
| 2009/0067210 A1 | 3/2009 | Leedy | |
| 2009/0160065 A1 | 6/2009 | Haba et al. | |
| 2009/0174082 A1 | 7/2009 | Leedy | |
| 2009/0175104 A1 | 7/2009 | Leedy | |
| 2009/0212381 A1 | 8/2009 | Crisp et al. | |
| 2009/0218700 A1 | 9/2009 | Leedy | |
| 2009/0219742 A1 | 9/2009 | Leedy | |
| 2009/0219743 A1 | 9/2009 | Leedy | |
| 2009/0219744 A1 | 9/2009 | Leedy | |
| 2009/0219772 A1 | 9/2009 | Leedy | |
| 2009/0230501 A1 | 9/2009 | Leedy | |
| 2009/0309235 A1 | 12/2009 | Suthiwongsunthorn et al. | |
| 2009/0316378 A1 | 12/2009 | Haba et al. | |
| 2010/0053407 A1 | 3/2010 | Crisp et al. | |

FOREIGN PATENT DOCUMENTS

| | | | |
|---|---|---|---|
| EP | 0926723 A1 | 6/1999 | |
| EP | 1041624 | 10/2000 | |
| EP | 1482553 A2 | 12/2004 | |
| EP | 1519410 A1 | 3/2005 | |
| EP | 1619722 A1 | 1/2006 | |
| EP | 1653510 A2 | 5/2006 | |
| EP | 1686627 A1 | 8/2006 | |
| EP | 1 741 668 A2 | 1/2007 | |
| EP | 1801866 A2 | 6/2007 | |
| FR | 2704690 | 11/1994 | |
| JP | 60160645 A | 8/1985 | |
| JP | 2001-217386 A | 8/2001 | |
| JP | 2003-037758 A | 2/2003 | |
| KR | 2006-0020822 A | 3/2006 | |
| WO | 9845130 A1 | 10/1998 | |
| WO | 9940624 | 8/1999 | |
| WO | 2004/025727 A1 | 3/2004 | |
| WO | 2004114397 | 12/2004 | |
| WO | 2005081315 | 9/2005 | |
| WO | 20090017758 A2 | 2/2009 | |
| WO | 20090017835 A2 | 2/2009 | |
| WO | 20090023462 A1 | 2/2009 | |

OTHER PUBLICATIONS

U.S. Appl. No. 60/962,200, filed Jul. 27, 2007.
U.S. Appl. No. 11/582,186, filed Oct. 17, 2006.
U.S. Appl. No. 60/963,209, filed Aug. 3, 2007.
U.S. Appl. No. 60/964,079, filed Aug. 3, 2007.
U.S. Appl. No. 60/964,069.
Bang, U.S. Appl. No. 60/030,463, filed Sep. 6, 2002.
International Search Report, PCT/US2009/003643, dated Aug. 28, 2009.
International Search Report, PCT/US2009/003643, dated Aug. 28, 2009.
International Search Report, PCT/US2008/009353.
U.S. Appl. No. 60/850,850.
International Search Report, PCT/US08/09207, dated Jan. 16, 2009.
U.S. Appl. No. 11/704,713.
Partial International Search Report, PCT/US2008/002659.
International Search Report, PCT/US2008/002659.
U.S. Appl. No. 12/143,743, "Recontituted Wafer Level Stacking", filed Jun. 20, 2008.
U.S. Appl. No. 11/590,616, filed Oct. 31, 2006.
U.S. Appl. No. 11/789,694, filed Apr. 25, 2007.
PCT/US08/09207, "Reconstituted Wafer Stack Packaging With After Applied Pad Extensions," filed Jul. 25, 2008.
International Search Report, PCT/US2008/009356.
International Search Report, PCT/US2008/010746, date May 27, 2009.
U.S. Appl. No. 12/723,039.
U.S. Appl. No. 12/456,349.
U.S. Appl. No. 12/670,952.
U.S. Appl. No. 12/671,993.
U.S. Appl. No. 12/784,841.
Communication from PCT/US2010/000777, dated Aug. 5, 2010.

* cited by examiner

RECONSTITUTED WAFER LEVEL STACKING

This application claims the benefit of U.S. Provisional Application 60/936,617 filed on Jun. 20, 2007. This application is also a continuation-in-part of U.S. patent application Ser. No, 11/787,209 filed on Apr. 13, 2007. U.S. patent application Ser. No. 11/787,209 is a continuation-in-part of U.S. patent application Ser. No. 11/704,713 filed on Feb. 9, 2007, which claims the benefit of U.S. Provisional Application 60/850,850 filed on Oct. 10, 2006.

BACKGROUND

The subject matter of the present application relates to microelectronic packages, or assemblies, comprised of stacked microelectronic elements and to methods of fabricating them, for example, by processing applied simultaneously to a plurality of microelectronic elements arranged in an array.

Microelectronic elements, such as semiconductor chips, are flat bodies with contacts disposed on the front surface that are connected to the internal electrical circuitry of the element itself. Microelectronic elements are typically packaged with substrates to form microelectronic packages, or assemblies, having terminals that are electrically connected to the element's contacts. The package or assembly may then be connected to test equipment to determine whether the packaged device conforms to a desired performance standard. Once tested, the package may be connected to a larger circuit, e.g., a circuit in an electronic product such as a computer or a cell phone.

Microelectronic packages or assemblies also include wafer level packages, which provide a package for a microelectronic component that is fabricated while the die are still in a wafer form. The wafer is subject to a number of additional process steps to form the package structure and the wafer is then diced to free the individual die. Wafer level processing may provide a cost savings advantage. Furthermore, the package footprint can be identical to the die size, resulting in very efficient utilization of area on a printed circuit board (PCB) to which the die will eventually be attached. As a result of these features, die packaged in this manner are commonly referred to as wafer-level chip scale packages (WLCSP).

In order to save space certain conventional designs have stacked multiple microelectronic chips or elements within a package or assembly. This allows the package to occupy a surface area on a substrate that is less than the total surface area of all the chips in the stack added together. Development efforts in this technology focus on producing wafer-level assemblies that are reliable, or thin, or testable, or which are economical to manufacture, or have a combination of such characteristics.

SUMMARY

A stacked microelectronic assembly is fabricated from a structure which includes a plurality of first microelectronic elements having front faces bonded to a carrier. Each first microelectronic element may have a first edge and a plurality of first traces extending along the front face towards the first edge. After exposing the first traces, a dielectric layer is formed over the plurality of first microelectronic elements. After thinning the dielectric layer, a plurality of second microelectronic elements are aligned and joined with the structure such that front faces of the second microelectronic elements are facing the rear faces of the plurality of first microelectronic elements. Processing is repeated to form the desirable number of layers of microelectronic elements. In one embodiment, the stacked layers of microelectronic elements may be notched at dicing lines to expose edges of traces, which may then be electrically connected to leads formed in the notches. Individual stacked microelectronic units may be separated from the stacked microelectronic assembly by any suitable dicing, sawing or breaking technique.

BRIEF DESCRIPTION OF THE DRAWINGS

The structure and methods of fabrication of the microelectronic devices described herein are best understood when the following description of several illustrated embodiments is read in connection with the accompanying drawings wherein the same reference numbers are used throughout the drawings to refer to the same or like parts. The drawings are not necessarily to scale; emphasis has instead been placed upon illustrating the structural and fabrication principles of the described embodiments. The drawings include.

DETAILED DESCRIPTION

First Embodiment of Method of Fabrication of Stacked Microelectronic Assembly

Figure 1A:
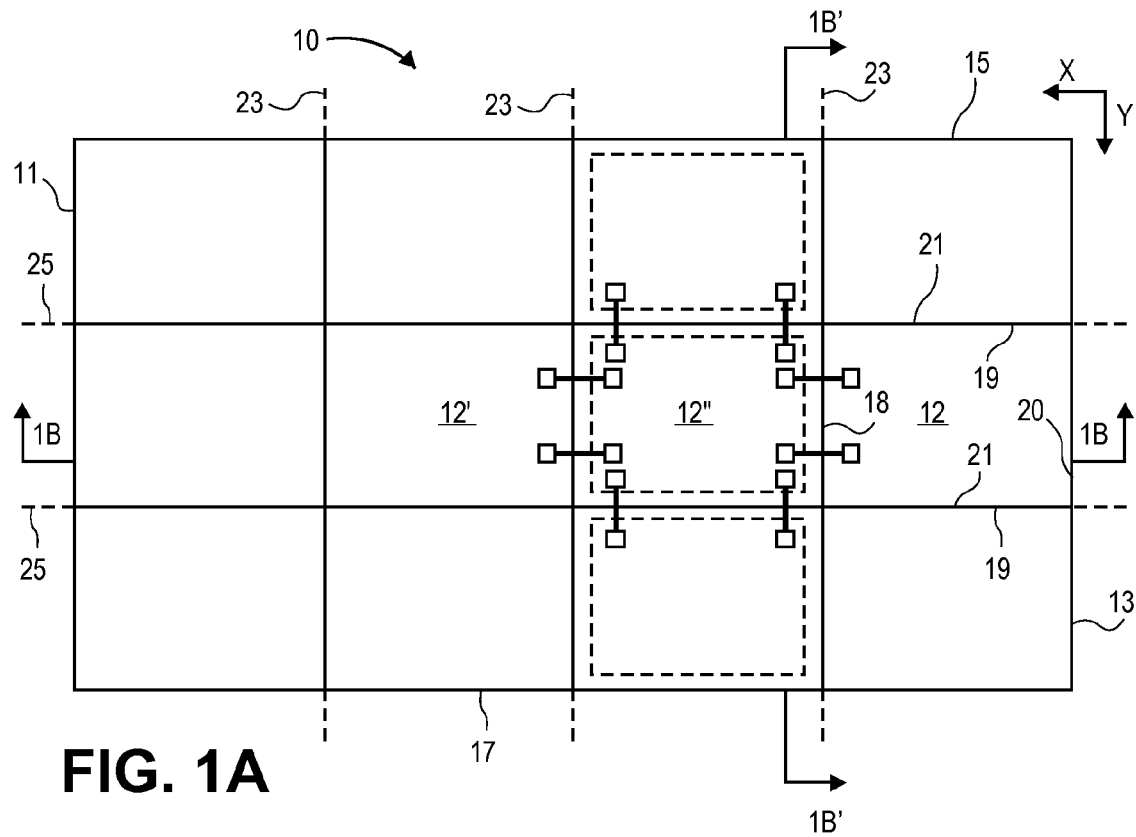
FIG. 1A is a top plan view of a wafer, or portion of a wafer, comprising microelectronic elements.
Figure 1B:
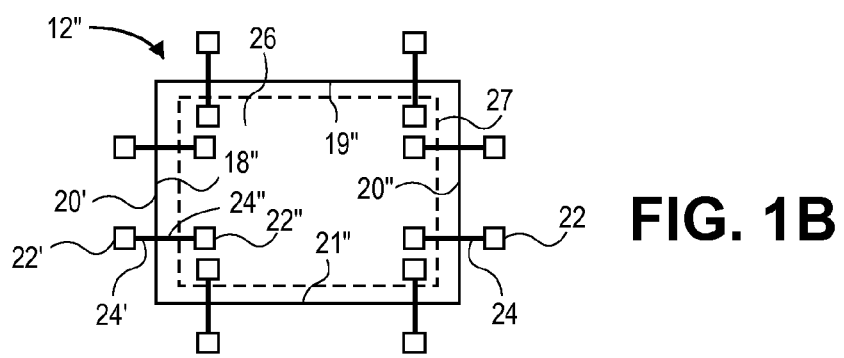
FIG. 1B is an enlarged portion of one of the microelectronic elements disposed on the wafer of FIG. 1A.
Figure 1C:
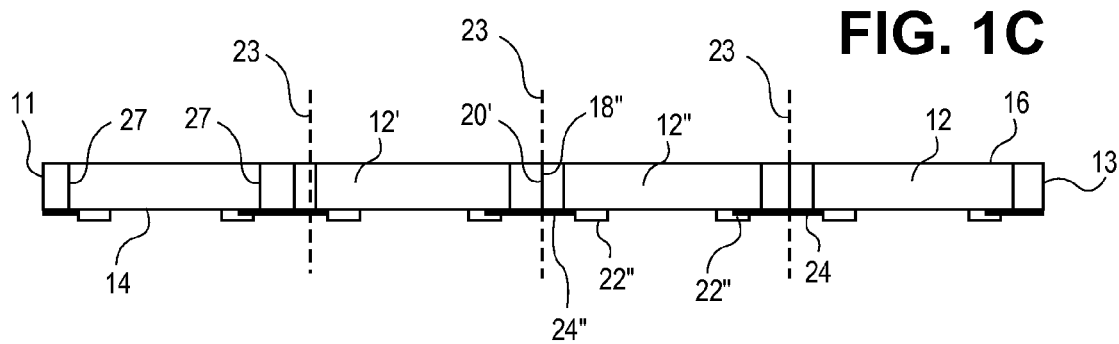
FIG. 1C is a side elevation view of a portion of the wafer of FIG. 1A taken at line 1B of FIG. 1A.

FIGS. 1A-1C illustrate an array, or a portion of an array, of microelectronic elements. FIG. 1A is a top plan view of wafer 10, or portion of a wafer 10, and includes a plurality of microelectronic elements shown as rectangles. Wafer 10 preferably includes numerous rows of microelectronic elements aligned along an X-axis and a Y-axis, in the form of an array. Wafer 10 may include any number of microelectronic elements including as little as two or as many as is desirable. Wafer 10 in FIG. 1A has a top edge 15, a right edge 13, a left edge 11 and a bottom edge 17. FIG. 1C is an elevated side view of wafer 10 taken along line 1B (FIG. 1A), showing left edge 11 and right edge 13 of wafer 10. FIG. 1C also shows that each microelectronic element of wafer 10 also has a front face 14 and an oppositely-facing rear face 16. Note that in FIG. 1C, the front face 14 of wafer 10 has been turned over to face down in the figure.

In FIG. 1A, three microelectronic elements 12, 12" (twelve double prime) and 12' (twelve prime) are individually called out in the middle row of wafer 10. The wafer can be in the shape of a circular wafer. Hereinafter, for ease of reference, the wafer 10 or wafer portion is referred to as a "wafer". The microelectronic elements are formed integral with one another using semiconductor fabrication techniques. Each of the microelectronic elements of the wafer is typically of the same type. The microelectronic elements can have memory function, logic or processor function or a combination of logic and processor functions, among other possible types. In a particular example, each of the microelectronic elements includes a flash memory. For example, each microelectronic element can be a dedicated flash memory chip.

With reference to microelectronic element 12 of FIG. 1A, each microelectronic element has a first edge 18, a second edge 20, a third edge 19 and a fourth edge 21. When microelectronic element 12 is still part of the array of wafer 10, a first edge 18 of one microelectronic element 12 abuts (or is attached to) second edge 20 of a second and adjacent microelectronic element 12. Similarly, a third edge 19 (FIG. 1A) of one microelectronic element 12 is attached to a fourth edge 21 of an adjacent microelectronic element. Thus, a microelectronic element 12" positioned in a middle row of the wafer portion 10 is bordered by an adjacent microelectronic element at all four edges, as shown in FIG. 1A. When microelectronic element 12 is entirely separated from wafer 10 (e.g., singulated therefrom), it can be seen that each of first edge 18, second edge 20, third edge 19 and fourth edge 21 extends from the front face 14 (FIG. 1C) to the rear face 16 (FIG. 1C) of the microelectronic element 12.

Portions of wafer 10 where adjacent microelectronic elements contact one another form saw lanes or strips 23 and 25 where the wafer can be cut without damaging the individual microelectronic elements. For instance, as shown in FIG. 1C, second edge 20' of microelectronic element 12' abuts first edge 18" of microelectronic element 12" and forms a saw lane 23. Similarly, throughout the wafer 10, saw lanes 23 (shown in FIGS. 1A and 1C) are located at positions where the microelectronic elements abut one another.

With reference to microelectronic element 12" of FIG. 1B, each microelectronic element includes a plurality of contacts 22" exposed at the respective front face 14 of the microelectronic element 12. The contacts 22 can be, for example, bond pads or lands of the microelectronic elements as originally formed in a wafer fabrication facility. Each microelectronic element of the uncut wafer 10 has a device region 26 (area bounded by dashed lines 27) in which active semiconductor devices and typically also passive devices are disposed. Each microelectronic element also includes a non-device region disposed beyond edges of the device region 26 where no active semiconductor devices or passive devices are disposed. Note that the bounded area of device region 26 is shown by solid lines in FIG. 1C. A trace 24 extends outwardly from each of the contacts 22 to a respective first, second, third or fourth edge 18, 20, 19, and 21 of each individual microelectronic element, crossing between the device region 26 and non-device region. For example, with reference to FIG. 1B, trace 24' extends outwardly from contact 22' towards the second edge 20' of microelectronic element 12' (FIG. 1A). The trace 24' extends to and contacts trace 24", which extends outwardly from contact 22". Thus, traces 24' and 24" meet at the attachment point of microelectronic elements 12' and 12" and may actually form a single trace extending between contact 22' and contact 22". However, it is not required that the traces actually contact one another. Similar structures may be included for all adjacent microelectronic elements 12. The traces 24 may be formed in the wafer fabrication facility at the same time or after the contacts 22 of the wafer are fabricated. Alternatively, the traces 24 may be formed by subsequent processing after the wafer 10 leaves the wafer fabrication facility, such as at a facility where processing as described below is performed.

Figure 2:
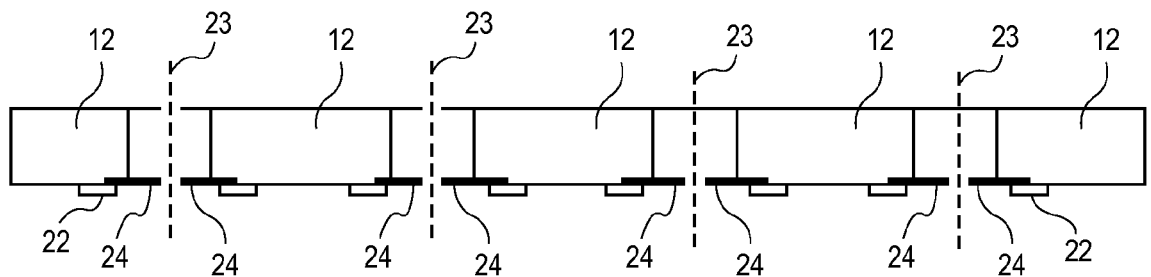
FIG. 2 is a side elevation view of several individual microelectronic elements separated from the wafer of FIG. 1A.
Figure 3:
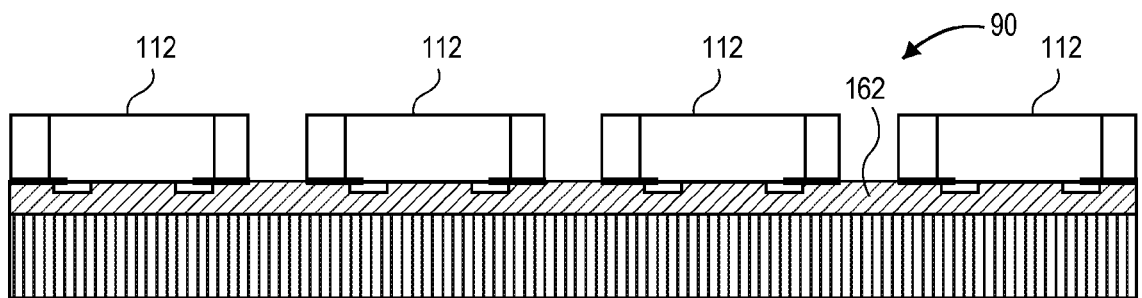
FIG. 3 is an elevated side view of a reconstituted wafer structure comprising individual microelectronic elements selected from the microelectronic elements of FIG. 2.

In one stacked assembly fabrication embodiment, an assembly including a plurality of stacked microelectronic elements is fabricated by simultaneously processing a plurality of microelectronic elements en masse. Moreover, processing can be carried out simultaneously as to microelectronic elements which are arranged in form of an array, similar to the processing of an original wafer containing such microelectronic elements. FIGS. 2-7B illustrate stages in a method of forming a package or assembly of stacked microelectronic elements in accordance with a first fabrication embodiment. In this embodiment, original wafer 10 is first separated into individual microelectronic elements and then selected ones of the individual microelectronic elements are arranged in form of an array for further processing. In this embodiment, the array of selected microelectronic elements can be considered a "reconstituted wafer" which is then available for processing according to wafer-level processing techniques. FIG. 2 illustrates a stage of fabrication in which an original wafer 10 is separated into individual microelectronic elements 12 by severing, e.g., sawing or scribing wafer 10 along the dicing lanes 23 and 25 (FIG. 1A). FIG. 3 is an elevated side view of reconstituted wafer structure 90 comprising individual microelectronic elements 112 that were selected from the microelectronic elements 12 obtained during the dicing (sawing) stage of FIG. 2. Individual microelectronic elements 112 are referred to as the known good die, and are attached in a face down position (i.e., with the front face of the die on which are disposed traces 24 and contacts 22) to a carrier 160 using an adhesive 162. A pick-and-place tool can be used to place each microelectronic element 112 at the proper position on the carrier 160 to form reconstituted wafer structure 90.

An advantage of processing reconstituted wafers rather than the original wafer 10 is that the microelectronic elements that make up each reconstituted wafer can be individually selected. In this way, when some of the microelectronic elements of the original wafer are of known or suspected marginal or failing quality, they need not be processed into stacked assemblies. Rather, those microelectronic elements can be left out of the reconstituted wafer such that the reconstituted wafer contains better quality microelectronic elements. Selection of the microelectronic elements to go into the reconstituted wafer can be made based on various criteria of quality or expected quality based on visual inspection, mechanical or electrical inspection or location of the microelectronic element within the original wafer 10. In a particular embodiment, microelectronic elements may in fact be tested electrically before placing each one into position on the reconstituted wafer. Whether the microelectronic elements are selected based on visual inspection, location or electrical test results, the microelectronic elements which are selected for inclusion in the reconstituted wafer can be referred to as "known good" microelectronic elements or "known good die".

Figure 4:
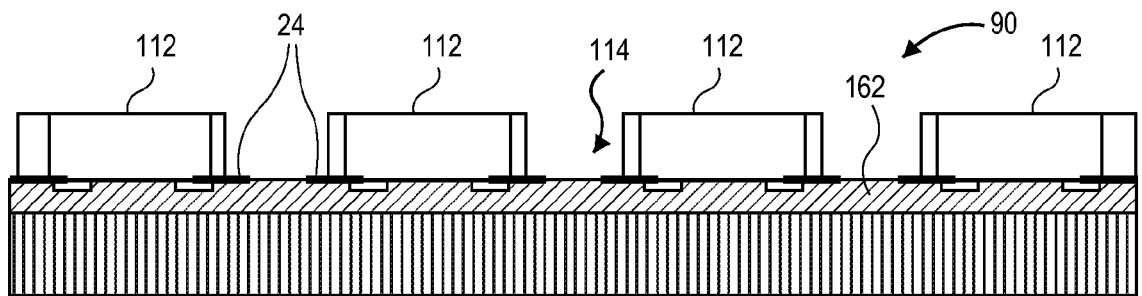
FIG. 4 is a cross-sectional view of the reconstituted wafer structure of FIG. 3 after an etchant is supplied to channels running between individual ones of the microelectronic elements to remove material from the edges of the microelectronic elements.

Next, as illustrated in FIG. 4, an etchant is supplied to channels 114 which run between individual ones of the microelectronic elements 112 of reconstituted wafer 90. The etchant is used to remove material from the edges of the microelectronic elements. As a result of this step, portions of the traces 24 at the front face of each microelectronic element become exposed within the channels.

Figure 5:
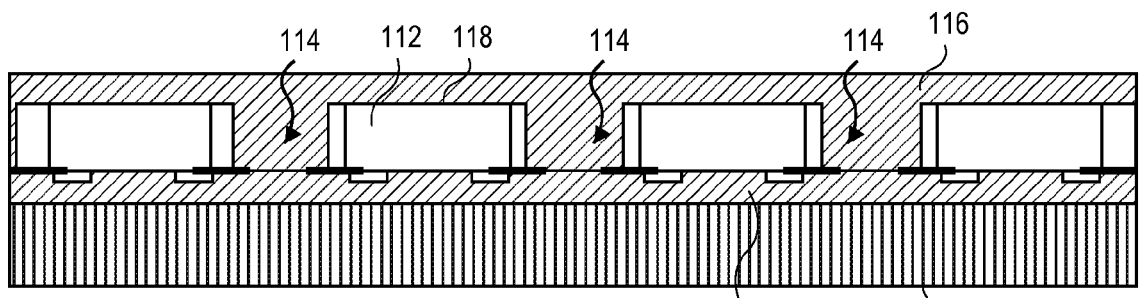
FIG. 5 is a cross-sectional view of the reconstituted wafer structure of FIG. 4 after a dielectric layer is formed over the structure.
Figure 6:
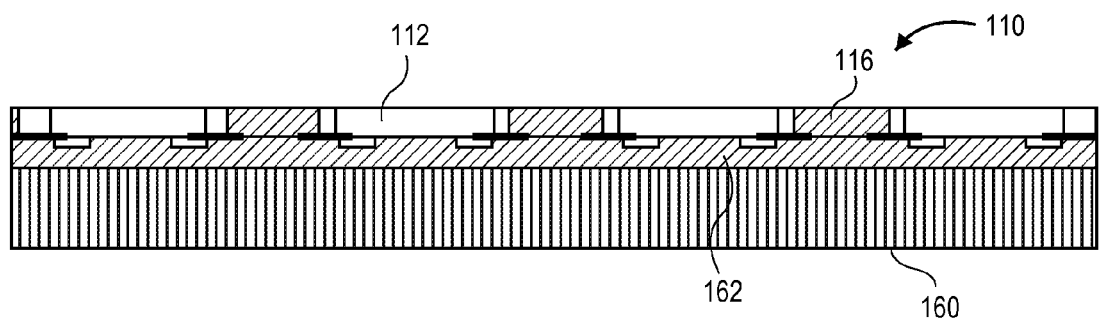
FIG. 6 is a cross-sectional view of the reconstituted wafer structure of FIG. 5 after the dielectric layer and microelectronic elements have been thinned to a desired height.

As illustrated in FIG. 5, a dielectric layer 116 is then formed over reconstituted wafer structure 90 of FIG. 4. Dielectric layer 116 fills channels 114 of reconstituted wafer structure 90, thereby covering rear faces 118 of the microelectronic elements 112. The dielectric layer can include one or more inorganic dielectric materials such as an oxide, nitride, which may include silicon dioxide, silicon nitride or other dielectric compound of silicon such as SiCOH, among others, or may include an organic dielectric, among which are various polymers such as epoxy, polyimide, among others. FIG. 6 is a side elevation view of reconstituted wafer structure 110 which is produced by reducing the thickness of each microelectronic element and dielectric layer 116 to a desired thickness by lapping, grinding or polishing reconstituted wafer structure 90 of FIG. 5 from the rear faces 118 of each microelectronic element 112.

Figure 7A:
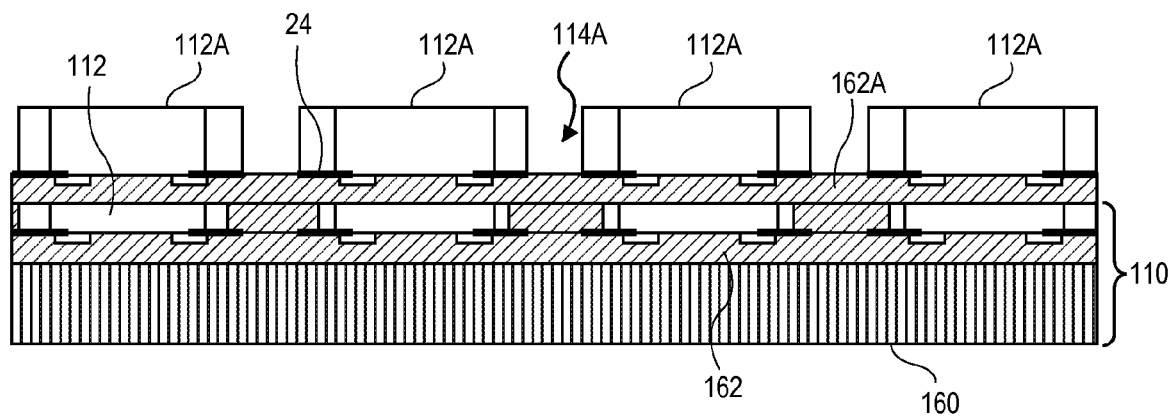
FIGS. 7A, 7B and 7C are cross-sectional views of a second reconstituted wafer structure being formed over the reconstituted wafer structure of FIG. 6.
Figure 7B:
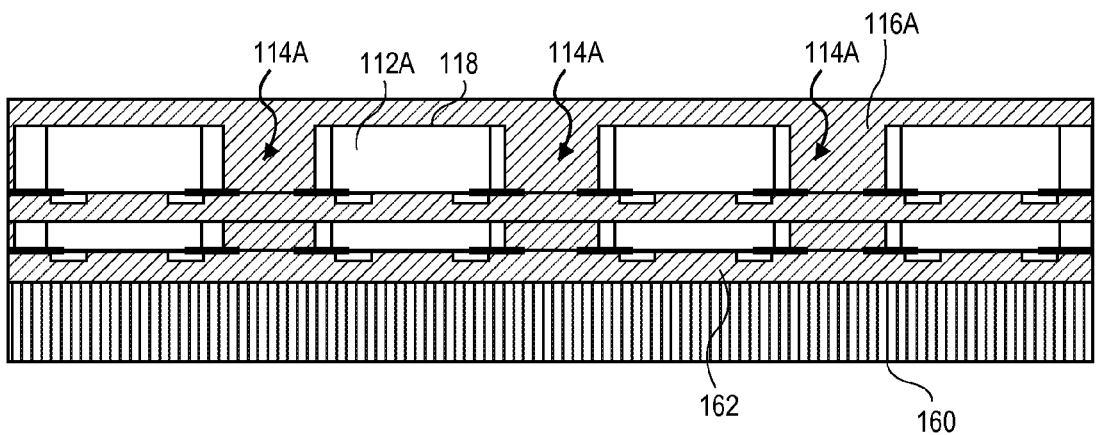
Figure 7C:
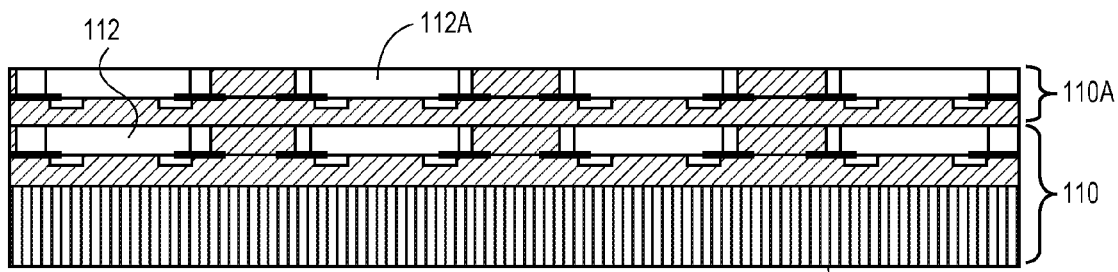

With reference to FIG. 7A, a next layer of known good die are then processed using reconstituted wafer 110 as a base or carrier layer. A second layer of known good microelectronic elements 112A are selected and attached to reconstituted wafer 110 using adhesive layer 162A which is deposited over reconstituted wafer 110. Desirably, the second layer of microelectronic elements is attached in registration with corresponding ones of the first microelectronic elements 112. The second layer of known good microelectronic elements 112A is processed in a manner similar to the process shown and described above with reference to FIGS. 4 through 6; that is, an etchant is supplied to channels 114A which run between individual ones of the microelectronic elements 112A of the second reconstituted wafer layer in order to remove material from the edges of microelectronic elements 112A so as to expose portions of the traces 24 within the channels at the front face of each microelectronic element. As shown in FIG. 7B, dielectric layer 116A is then formed over the second reconstituted wafer layer of FIG. 7A to fill channels 114A, thereby covering rear faces 118 of the microelectronic elements 112A. Then the thickness of each microelectronic element 112A and dielectric layer 116A is reduced to a desired thickness by lapping, grinding or polishing the second reconstituted wafer layer of FIG. 7B from the rear faces 118 of each microelectronic element 112A. At the conclusion of this processing, a second reconstituted wafer 110A is formed, as shown in FIG. 7C.

Figure 7D:
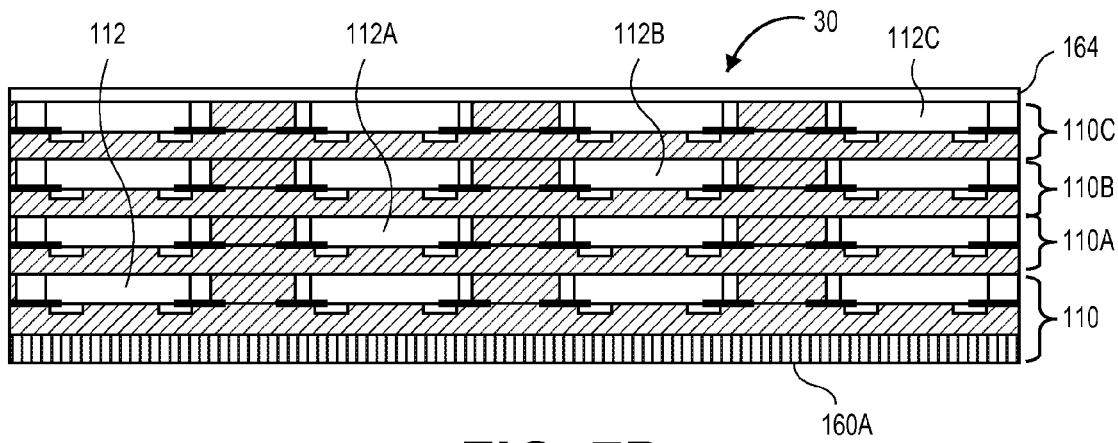
FIG. 7D is a cross-sectional view of a stacked microelectronic assembly comprising four reconstituted wafers.

Thereafter, with reference to FIG. 7D, if it is desired to add further layers of microelectronic elements to the stack of microelectronic elements of FIG. 7C, an adhesive layer is formed to overlie microelectronic elements 112A and a third layer of microelectronic elements 112B are then attached to that adhesive layer and processed in a manner similar to the process shown and described above with reference to FIGS. 7A through 7C to form third reconstituted wafer 110B. A fourth layer of microelectronic elements 112C may also be formed in a similar manner by forming an adhesive layer over microelectronic elements 112B and attaching a fourth layer of microelectronic elements 112C to that adhesive layer and subsequently processing the fourth layer in the same manner as described above to form fourth reconstituted wafer 110C. The thickness of carrier layer 160 (FIG. 7C) may be reduced at this time using any suitable lapping, grinding or polishing process to form reduced carrier layer 160A. In addition, a protective layer 164 including a dielectric and which may include an adhesive (not separately shown in the figure) may be formed to cover the uppermost layer of microelectronic elements 112C. Together this processing forms stacked assembly 30.

Figure 8:
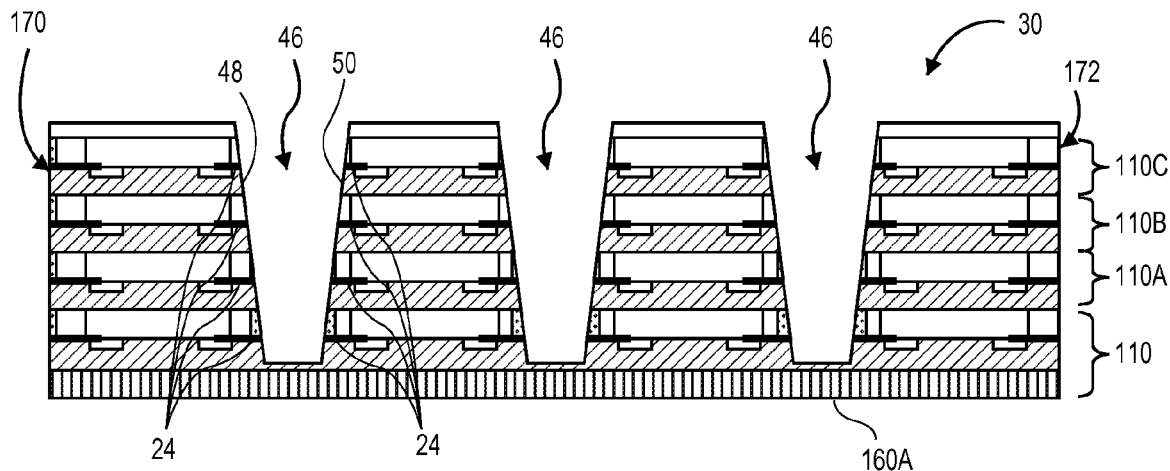
FIG. 8 is a sectional view illustrating a stage of fabrication of stacked microelectronic assembly subsequent to that shown in FIG. 7D in which notches are cut into the assembly.

FIG. 8 is a sectional view illustrating a stage of fabrication of stacked assembly 30 subsequent to that shown in FIG. 7D. The processing illustrated with reference to FIGS. 8-10 need not be performed in any particular orientation; the individual microelectronic elements in stacked assembly 30 may have front faces oriented upwardly, downwardly or to a side. Referring to FIG. 8, a plurality of notches 46 are cut into the stacked assembly 30. The notches 46 are preferably formed using a mechanical cutting instrument not shown in the figures. Examples of such a mechanical cutting instrument can be found in U.S. Pat. Nos. 6,646,289 and 6,972,480, the disclosures of which are hereby incorporated by reference herein. Alternatively, a laser drilling technique can be used to form notches 46. As compared to FIG. 7D and as shown in FIG. 8, notches 46 are cut from the stacked assembly 30 at locations between microelectronic elements that are horizontally adjacent in their respective reconstituted wafers 110, 110A, 110B and 110C. With reference back to FIGS. 1A, 1B and 1C, these locations are proximate to respective first edges 18 and second edges 20 of each microelectronic element. Although not shown in the sectional view of FIG. 8, notches may also be formed in locations that are proximate to respective third edges 19 and fourth edges 21 of each microelectronic element in reconstituted wafers 110, 110A, 110B and 110C.

In the embodiment shown in FIG. 8, the individual microelectronic elements in each reconstituted wafer 110, 110A, 110B and 110C are aligned throughout stacked assembly 30. Thus, a single cut may be used to form notches 46 between individual stacked microelectronic elements. In the embodiment shown in FIG. 8, notches 46 do not extend entirely through stacked assembly 30. For instance, as shown in FIG. 8, the microelectronic elements of reconstituted wafer 110 remain attached to each other as the various notches 46 do not extend entirely through reduced carrier layer 160A underlying first reconstituted wafer 110. However, notches 46 are sufficiently wide and deep so as to intersect, and thus expose the edges of, traces 24 (represented as dark thick horizontal lines) that extend out from the contacts disposed on the front faces of the individual microelectronic elements of each reconstituted wafer 110, 110A, 110B and 110C. In the embodiment of FIG. 8, notches 46 are illustrated having inclined side walls 48, 50. In another embodiment not illustrated in a figure herein, the side walls may be straight, i.e., oriented in a normal direction to a plane defined by the front faces of the microelectronic elements.

First exposed side edge 170 and second exposed side edge 172 of stacked assembly 30 need not be cut to expose edges of the traces because the edges of the traces (represented as dark thick horizontal lines) that extend toward these respective edges are already exposed. In another embodiment not illustrated in a figure herein, first and second side edges 170 and 172 may be cut so as to create a more symmetrical configuration. Similarly, the other two side edges of stacked assembly 30 not shown in the figures also do not have to be cut, although it may be desirable to do so.

Figure 9:
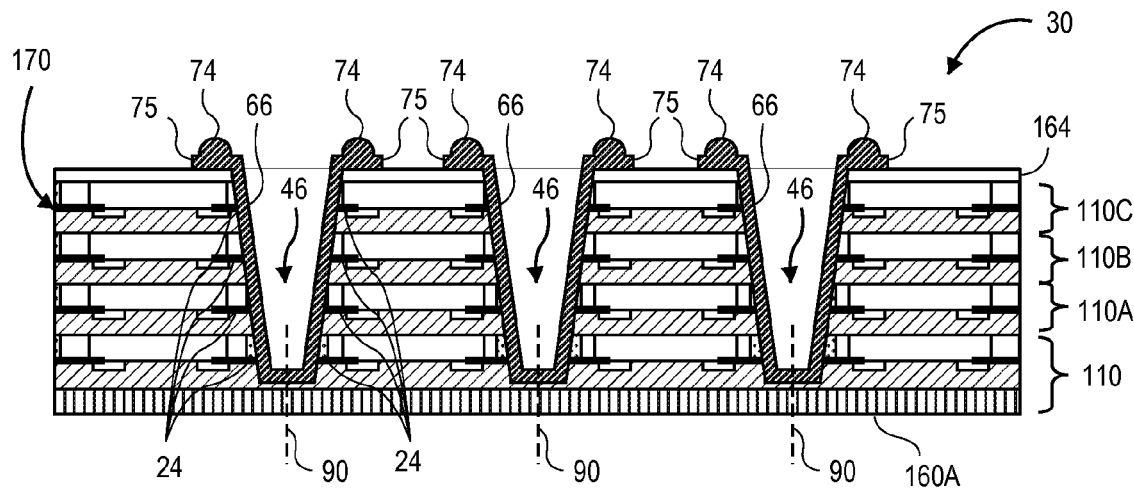
FIG. 9 is a sectional view of stacked microelectronic assembly after notches have been created, showing the formation of leads on the side walls of the notches.

FIG. 9 is a sectional view of stacked assembly 30 after notches 46 have been created, showing the formation of leads 66 on the side walls 48, 50 (FIG. 8) of notches 46. Leads 66 may be formed by any suitable metal deposition technique, for example, a process that includes sputtering, three-dimensional lithography and electroplating. Additional processes may also be employed. One such process is disclosed in U.S. Pat. No. 5,716,759, the disclosure of which is hereby incorporated by reference herein. Depending on the particular process used, lead formation may comprise depositing a metal layer across the entire length and depth of a notch 46, and then etching the metal away in areas where there are no exposed edges of traces 24. When the lead formation process is completed, each of a set of individual leads 66 extends within a notch 46 at the location of the exposed edges of a set of aligned traces 24 of reconstituted wafers 110, 110A, 110B and 110C, thereby establishing electrical contact with the exposed edges of that set of traces 24. In the embodiment shown in FIG. 9, leads 66 include end lead portion 75 which extends past the side wall of each notch 46 onto protective layer 164 positioned above reconstituted wafer 110C. If protective layer 164 is not provided, end lead portion 75 extends past the side wall of each notch 46 onto the rear face of the individual microelectronic elements that form reconstituted wafer 110C. Pads or solder bumps 74 may be formed to be in contact with end lead portion 75 as shown.

With continued reference to FIG. 9, when traces 24 disposed on the face of individual microelectronic elements in each reconstituted wafer 110, 110A, 110B and 110C in a stack are in alignment among the respective reconstituted wafers, each lead 66 is in contact with all of the edges of the traces 24 exposed at a respective side wall of notch 46. However, in another embodiment, a lead 66 may be in electrical connection with fewer than all of the traces 24 of the stacked microelectronic elements in a set of reconstituted wafers 110, 10A, 110B and 11C when traces 24 disposed on one microelectronic element in one reconstituted wafer layer are not in exact alignment or lie in different planes than traces 24 disposed on microelectronic elements in a second, third or fourth reconstituted wafer layer.

With continued reference to FIG. 9, after notches 46 and conductive elements including leads 66, end lead portions 75 and solder bumps 74 are formed on stacked assembly 30, reduced carrier layer 160A of stacked assembly 30 may be severed by mechanically cutting or, alternatively, scribing and breaking reconstituted wafer 110 at locations 90 proximate to notches 46. In this way, a plurality of individual units are produced, with each individual unit containing a plurality of microelectronic elements stacked one upon another.

Figure 10A:
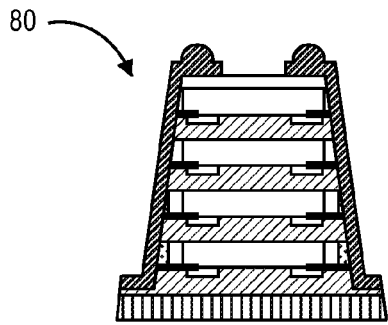
FIGS. 10A, 10B and 10C illustrate various embodiments of individual stacked microelectronic units produced from the embodiment of stacked microelectronic assembly of FIG. 9.
Figure 10B:
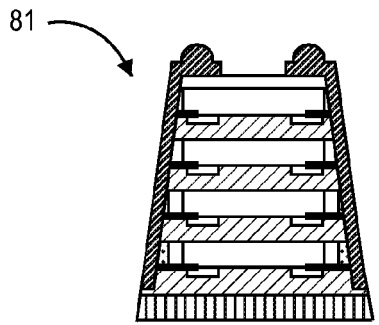
Figure 10C:
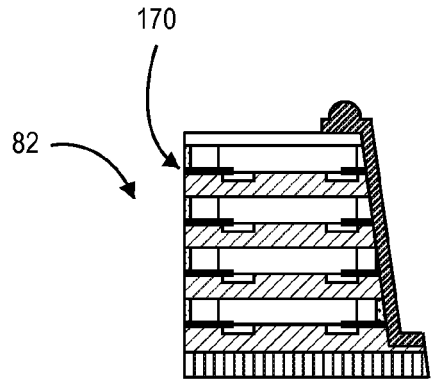

FIGS. 10A and 10B illustrate two embodiments of individual units 80 and 81 from the embodiment of stacked assembly 30 of FIG. 9 with inclined sidewalls in which the severing, or singulation, process at locations 90 of FIG. 9 achieves different profiles, depending on the method used and the precision of the cutting instrument, if one is used. As noted above, individual units produced from a stack of microelectronic elements need not have inclined sidewalls; single units with sidewalls normal to reduced carrier layer 160A are not illustrated in the figures. Also noted above, individual units produced from the stacked reconstituted wafers of microelectronic elements located at the ends of stacked assembly 30 may or may not have inclined sidewalls all around. FIG. 10C illustrates individual unit 82 produced after singulation from the embodiment of stacked assembly 30 of FIG. 9 that includes left edge 170.

Figure 11:
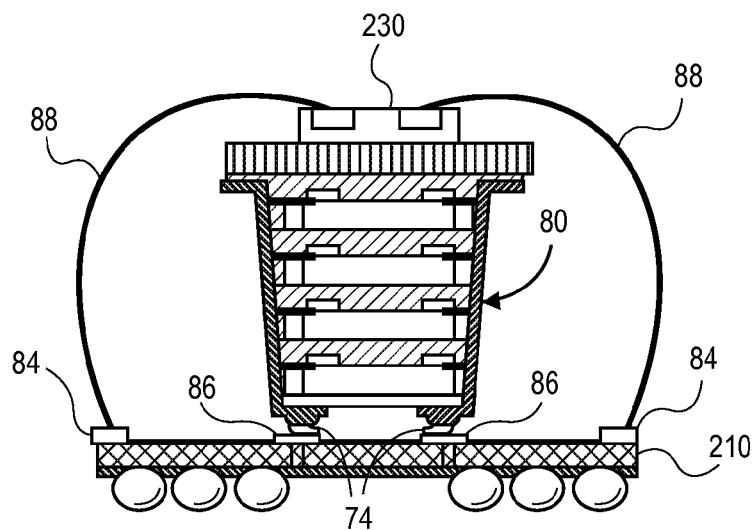
FIG. 11 is an exemplary embodiment of the individual stacked microelectronic unit of FIG. 10A electrically connected to an interconnection element.

Any one of individual stacked assemblies 80, 81 or 82 of FIGS. 10A, 10B or 10C can be electrically connected to other electronic elements or substrates. FIG. 11 is an exemplary embodiment of stacked assembly 80, shown inverted from the view in FIG. 10A, electrically connected via solder bumps 74 to an interconnection element 210, e.g., a dielectric element, substrate, circuit panel or other element having terminals 84, 86 and conductive wiring therein. One or more additional microelectronic elements 230 can be attached to the face of assembly 80 opposite the face comprising solder bumps 74 and electrically interconnected by bond wires 88 to terminals 84 of the interconnection element 210. Examples of microelectronic element 230 may include one or more additional microelectronic elements which supplement the function of the stacked assembly, such as, by way of example and not intended to be exhaustive, a microcontroller. Microelectronic element 230 may include one or more redundancy elements for substitution with one or more of the individual microelectronic elements in stacked individual unit 80, in case of a problem with such microelectronic element. In a particular embodiment, the stacked individual unit 80 may be incorporated into microprocessors, and RF units among other assemblies. One or more stacked units 80 may incorporate particular types of microelectronic elements such as flash memory or dynamic random access memory (DRAM) units and be incorporated in various units including memory modules, memory cards, and the like. Other exemplary arrangements for electrically connecting stacked individual unit 80 to an interconnection element, and for mounting additional microelectronic elements to stacked individual unit 80 are shown and described in commonly owned U.S. patent application Ser. No. 11/787,209 filed Apr. 13, 2007, published as U.S. Patent Application Publication 2008/0083977 A1, the disclosure of which is hereby incorporated herein by reference.

Embodiments of Stacked Microelectronic Assemblies Using Vias to Provide Electrical Access Conductive Traces With reference to FIGS. 7D and 8, electrical access to conductive traces 24 in all reconstituted wafer layers 110, 110A, 110B and 110C is achieved by cutting notches 46 into stacked assembly 30 in the manner shown in these figures and described above with reference thereto, in order to expose the edges of conductive traces 24 to the later-applied leads 66 (FIG. 9). Lead formation is achieved by using a suitable metal deposition technique to deposit a metal layer onto the surfaces of each notch 46. Such metal deposition techniques may require metal etching to form leads that provide electrical access to only the exposed edges of traces disposed on the front faces of the microelectronic elements that are vertically aligned in the reconstituted wafer layers 110C, 110B, 110A and 110.

Figure 12:
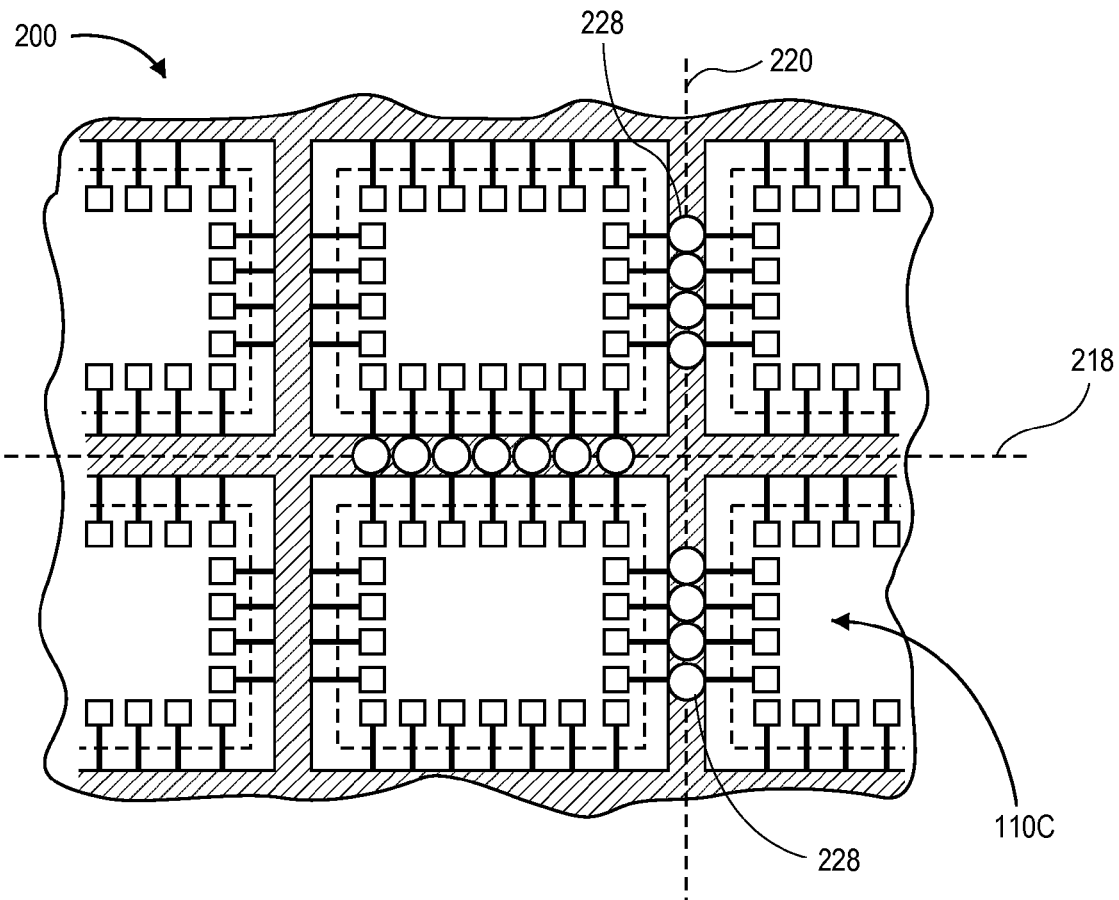
FIG. 12 is a partial top plan view 200 of the stacked microelectronic assembly of FIG. 7D and showing openings made between adjacent microelectronic elements.

In another embodiment, electrical access may be made to conductive traces 24 in reconstituted wafer layers 110, 110A, 110B and 110C by making openings, or vias, into stacked assembly 30 at the locations of the traces, using any suitable drilling technique, such as a laser drilling technique. FIG. 12 is a partial top plan view 200 of stacked assembly 30 of FIG. 7D looking down at top reconstituted wafer 110C, assuming for purposes of this discussion that protective layer 164 is at least partially transparent or is not present in this embodiment. Openings, or vias, 228 are represented by small grey circles; while not labeled as such, it is to be understood from the figure that each grey circle represented is an opening 228. In FIG. 12, representative ones of openings 228 are formed in saw lanes 218 and 220 of reconstituted wafer 110C between adjacent microelectronic elements and extend through stacked assembly 30 to reach to reconstituted wafer 110. Each opening 228 thus exposes the edges of all of the traces 24 disposed on the front faces of each of the pairs of vertically aligned and adjacent microelectronic elements in all of reconstituted wafer layers 110C, 110B, 110A and 110. The individual openings 228 are plated using a suitable metal deposition technique, after which a singulation (e.g., dicing) process produces individual stacked microelectronic units from stacked assembly 30 similar to those shown in FIGS. 10A, 10B and 10C.

In another embodiment, using the technique described above with respect to FIG. 12, electrical access may be made to all or selective ones of the conductive traces 24 in selective ones of reconstituted wafer layers 110, 110A, 110B and 110C by making openings to selected depths into stacked assembly 30 at selected locations.

Figure 13:
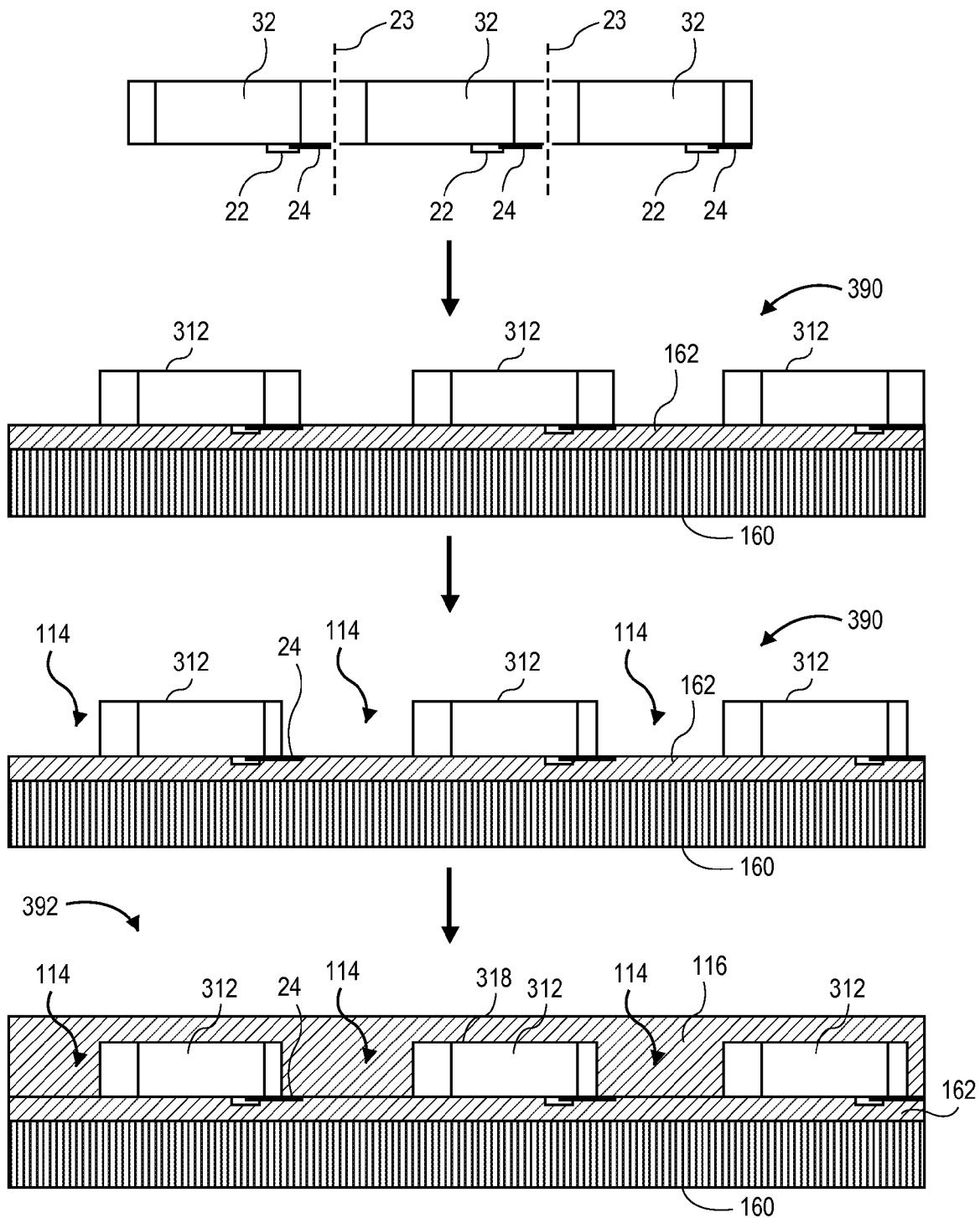
FIG. 13 shows a series of side elevation views of structures illustrating initial stages in the formation of stacked microelectronic units according to a second embodiment.

Stacked Microelectronic Unit Embodiment Comprising Offset Microelectronic Elements FIGS. 13-17 illustrate another embodiment for forming stacked microelectronic units. FIG. 13 shows a series of side elevation views of structures illustrating initial stages in the formation of stacked microelectronic units according to this embodiment. Microelectronic elements 32 having bond pads 22 connected to traces 24 are separated from an original wafer (not shown) along saw lines 23. Selected microelectronic elements 312 (e.g., known good die) from among microelectronic elements 32 are attached to carrier 160 using adhesive layer 162 to form reconstituted wafer structure 390. Then, in a manner similar to the processes described with respect to FIGS. 4 and 5 above, an etchant is supplied to channels 114 which run between individual ones of the microelectronic elements 312 to remove material from the edges of the microelectronic elements in order to expose within channels 114 portions of the traces 24 at the front face of each microelectronic element 312. A dielectric layer 116 is then formed over reconstituted wafer structure 390 to fill channels 114, thereby covering rear faces 118 of the microelectronic elements 312 and producing reconstituted wafer structure 392.

Figure 14:
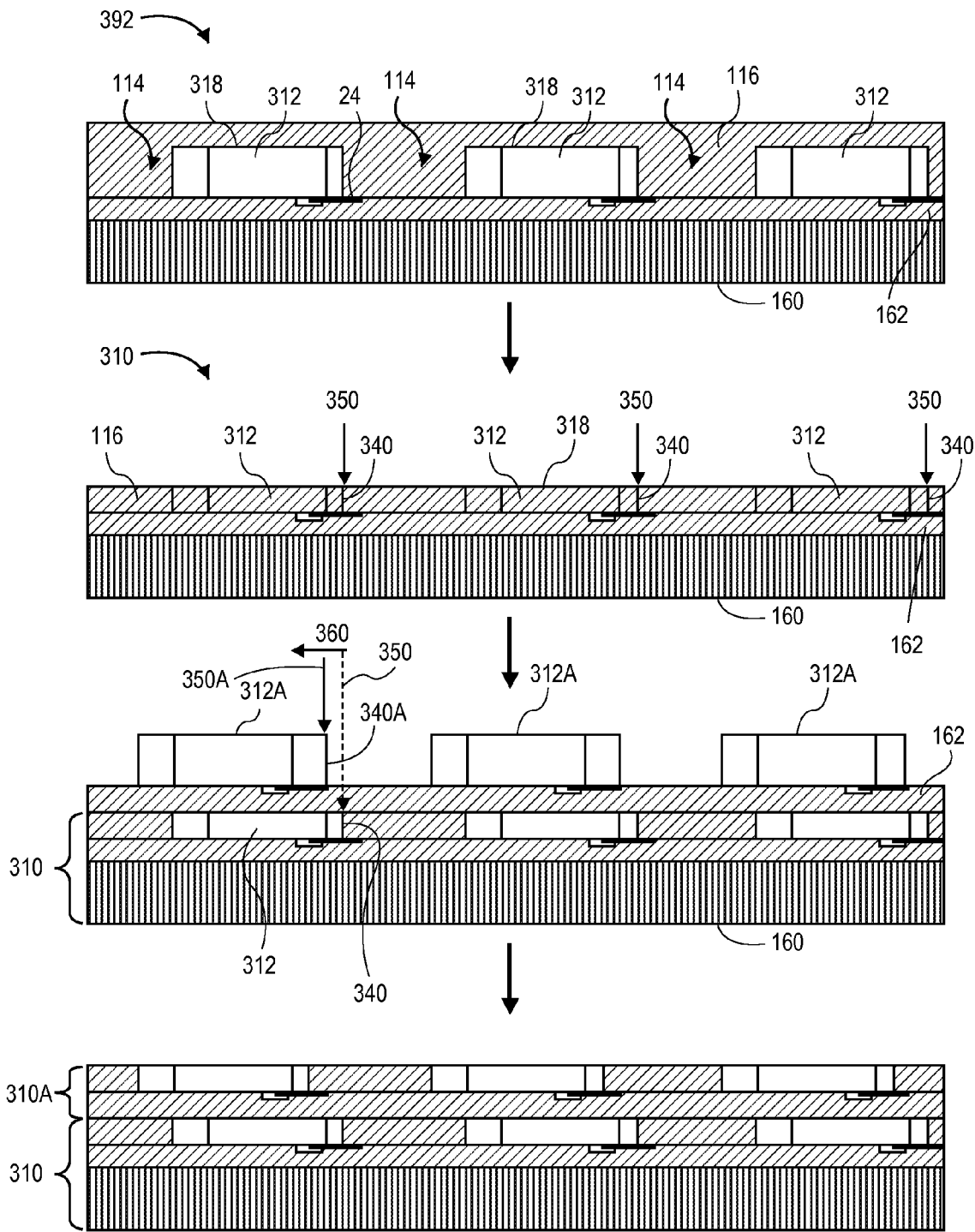
FIG. 14 shows a series of side elevation views of structures illustrating the next stages in the formation of stacked microelectronic units according to the second embodiment.
Figure 15:
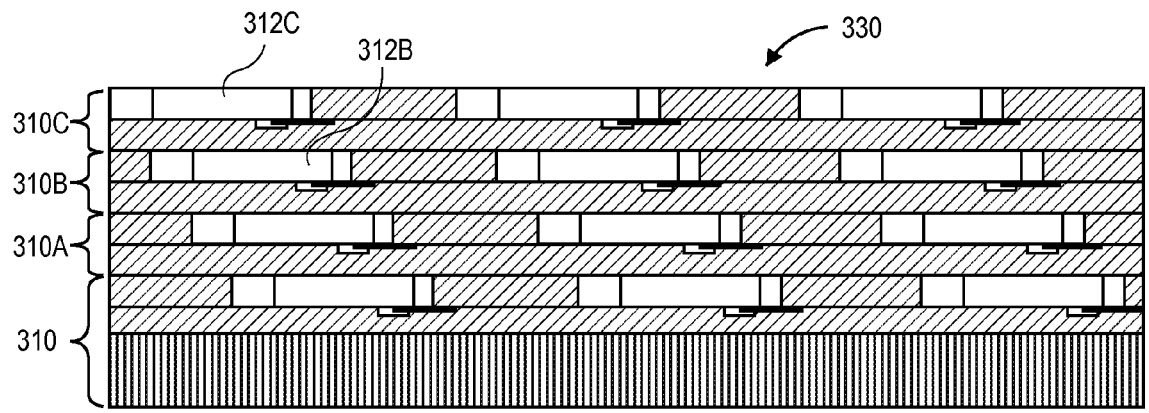
FIG. 15 is a sectional view of the stacked microelectronic assembly produced by the processes illustrated in FIGS. 13 and 14.

FIG. 14 shows a series of side elevation views of structures illustrating the next stages in the formation of stacked microelectronic units according to this embodiment. Reconstituted wafer structure 392 of FIG. 13 is then thinned to produce reconstituted wafer 310 by reducing the thickness of each microelectronic element and dielectric layer 116 to a desired thickness by lapping, grinding or polishing reconstituted wafer structure 392 from the rear faces 118 of each microelectronic element 312. Arrows 350 mark the lateral position of each edge 340 of each microelectronic element of reconstituted wafer 310.

After thinning first reconstituted wafer 310 to the desired thickness, the microelectronic elements 312A needed to form a second reconstituted wafer 310A are bonded to reconstituted wafer 310 such that an edge 340A of a microelectronic element 312A of the second reconstituted wafer structure to be formed occurs at position 350A which is offset in a lateral direction 360 from the edge 340 of microelectronic element 312 of the first reconstituted wafer 310. Thus, when referring to microelectronic elements 312A of the second reconstituted wafer as the overlying microelectronic elements and microelectronic elements 312 of the first reconstituted wafer 310 as the underlying microelectronic elements, each overlying microelectronic element 312A has an area overlapping an area of the underlying microelectronic element 312 of reconstituted wafer 310 to which element 312A is bonded, and each has an edge 340A that is displaced in the lateral direction 360 from the edge 340 of the underlying microelectronic element 312. An exemplary distance of the lateral offset between edges of vertically adjacent overlapping microelectronic elements can range from a few microns to tens of microns or more.

Figure 16:
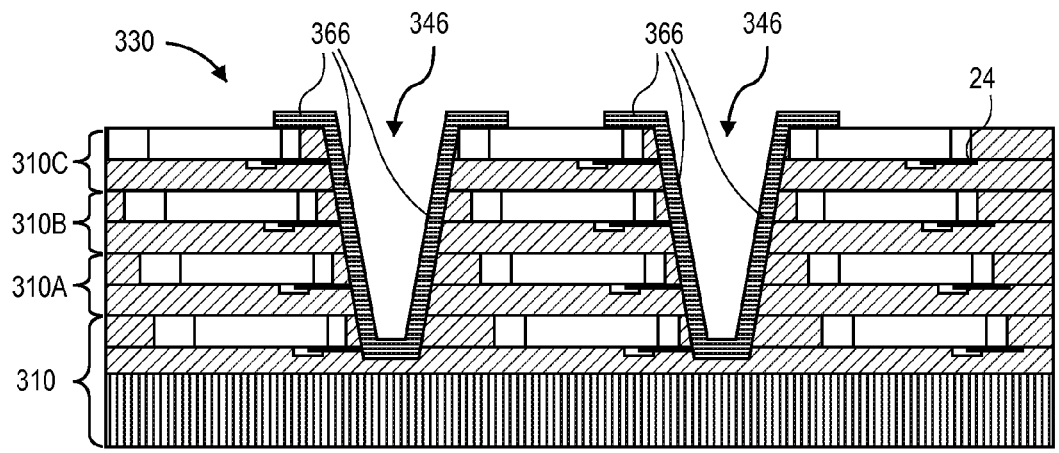
FIG. 16 is a sectional view of the stacked microelectronic assembly of the second embodiment, after notches have been formed between adjacent microelectronic elements.

With continued reference to FIG. 14, the formation of second reconstituted wafer 310A is completed with the etching process, the application of the dielectric layer, and thinning process shown in FIG. 13 with respect to reconstituted wafer 310, omitted in FIG. 14. The sub-processes shown in FIG. 14 are repeated for forming a third reconstituted wafer 310B containing microelectronic elements 312B and a fourth reconstituted wafer 310C containing microelectronic elements 312C to form the stacked assembly 330 shown in FIG. 15. As illustrated in FIG. 16, notches 346 are then cut between adjacent elements to expose the edges of the traces disposed on the front faces of the microelectronic elements in each reconstituted wafer 310, 310A, 310B and 310C.

An advantage of forming the stacked assembly in this manner is that process tolerances can improve for forming leads 366 (FIG. 16) adjacent to the exposed edges of the traces at the sidewalls of each notch 346. The lateral displacement of each succeeding overlapping microelectronic element in the stacked assembly allows for slope in the sidewalls of each notch 346 formed therein. Increased lateral displacement allows the sidewalls of each notch 346 to be more heavily sloped, i.e., at a greater angle from the vertical. "Vertical" is defined herein as a normal angle to the plane defined by the contact-bearing surface of a microelectronic element, e.g., element 312. Despite greater slope of the wall, the notching operation, performed, e.g., by cutting or laser drilling exposes trace edges even when the length of such traces is limited. Particularly when the traces 24 are formed on each original wafer (FIGS. 1A-B) prior to dicing and forming reconstituted wafers, traces 24 can have very limited length.

Figure 17:
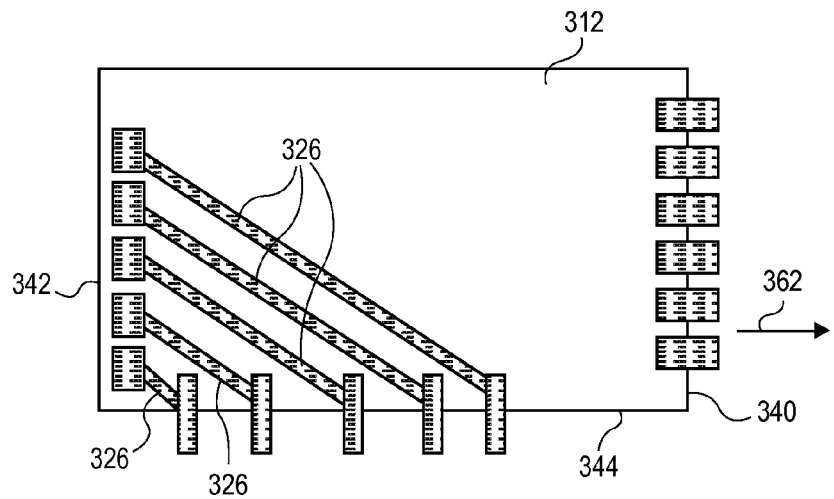
FIG. 17 is a top plan view of a portion of the stacked microelectronic assembly of FIG. 16 illustrating the redistribution of electrical signals from a set of contacts at a first edge of a microelectronic element to a second edge.

With reference to FIG. 17, when the microelectronic elements 312 are provided with contact pads adjacent to edges 340 and 342, a redistribution layer including additional traces 326 can be provided which extends between the pads at edge 342 and outwardly beyond a third edge 344 of the microelectronic element 312. When forming the stacked assembly, 330, overlapping microelectronic elements of each successively stacked reconstituted wafer 310, 310A, 310B and 310C can be offset as well in a direction 362. In this way, leads can be formed in notches which expose traces 326 along the third edges 344 of the overlapping microelectronic elements, and process tolerance can also be improved for forming such leads.

Fabrication Embodiment of Stacked Microelectronic Assembly

Figure 18:
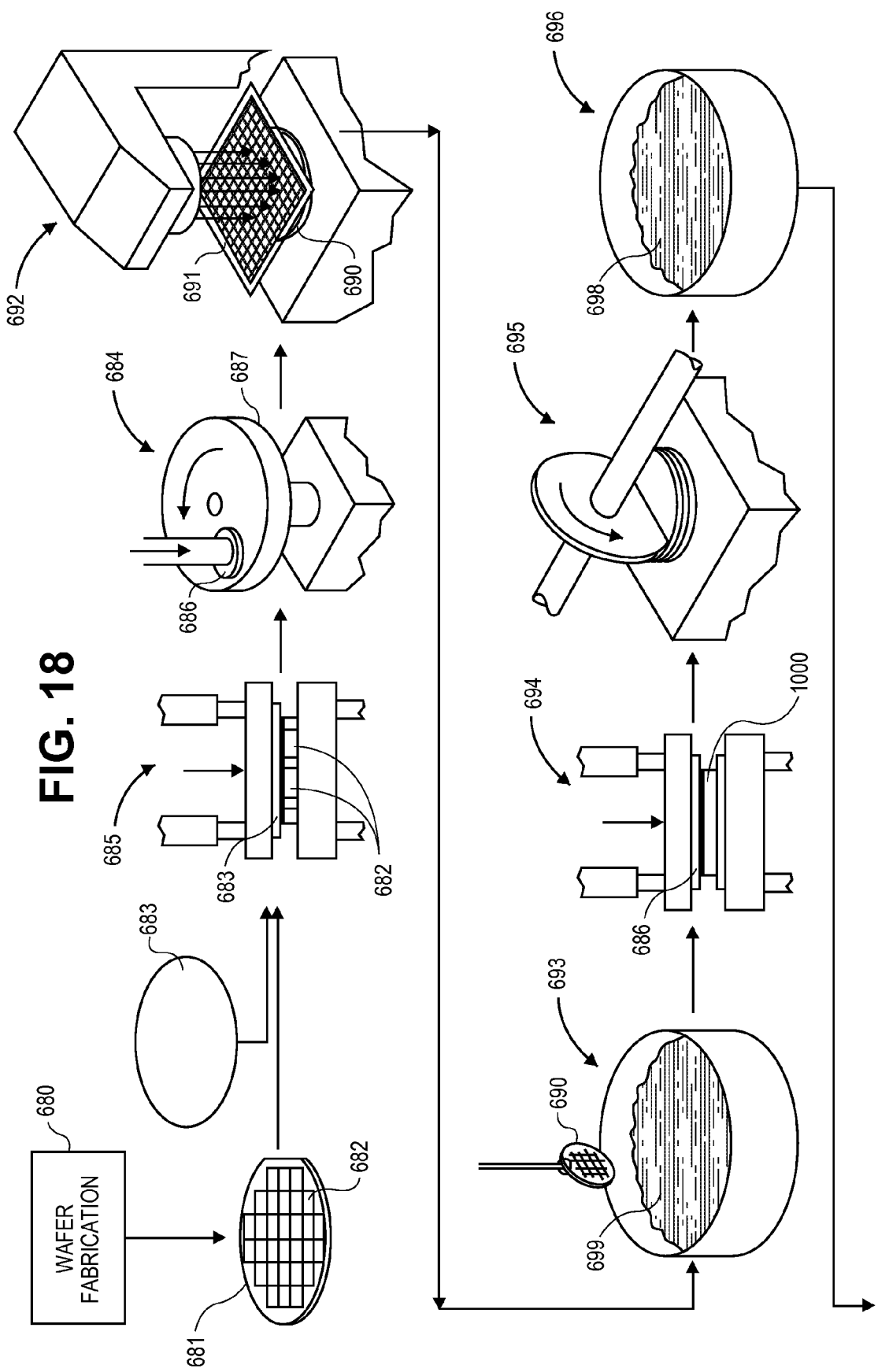
FIGS. 18 and 19 pictorially illustrate manufacturing apparatus and processes used in the fabrication of the stacked microelectronic units described and shown herein.
Figure 19:
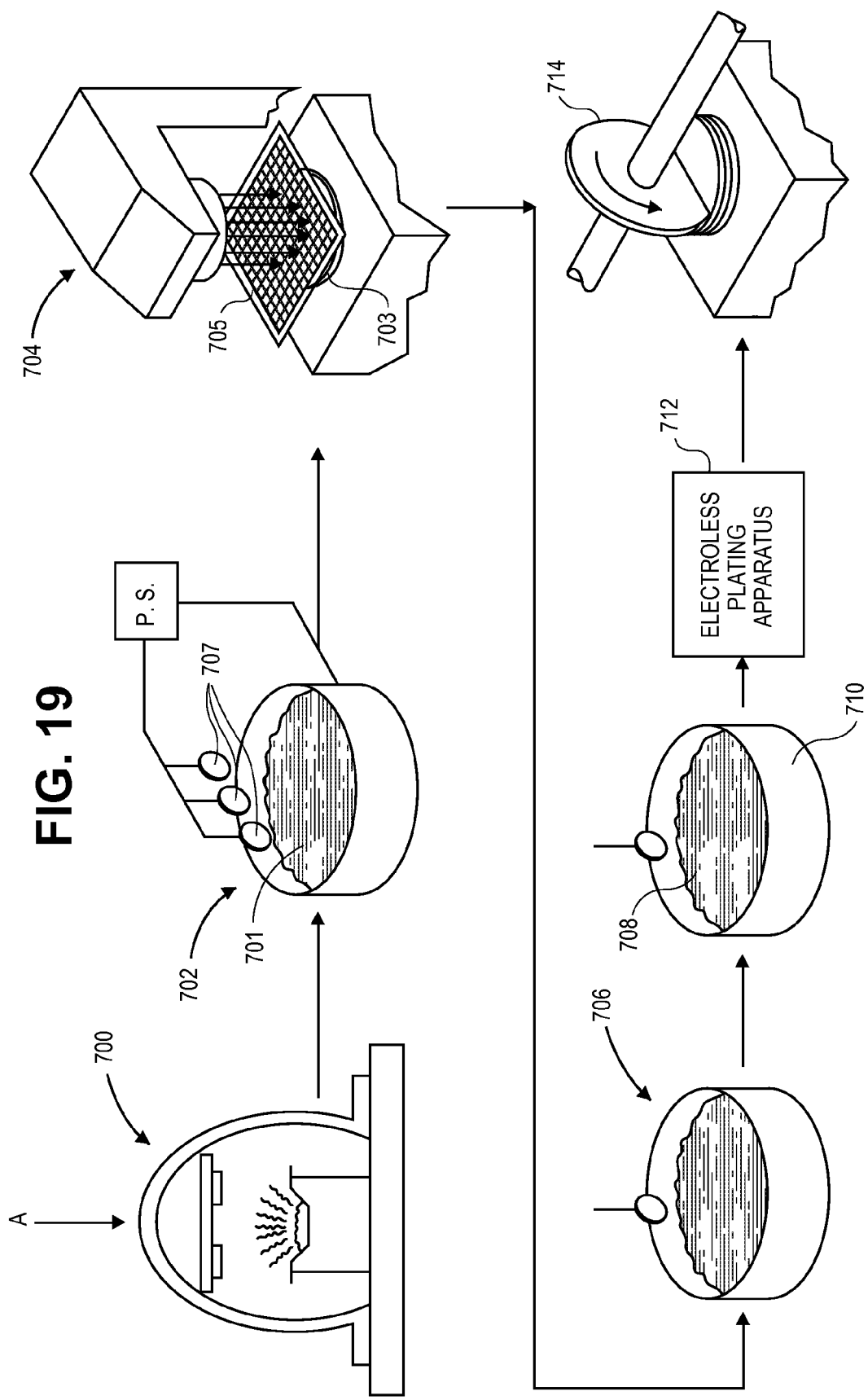

Reference is now made to FIGS. 18 and 19, which are illustrations of apparatus employed in the manufacture of assemblies of the types discussed herein. As seen in FIGS. 18 and 19, a conventional wafer fabrication facility 680 provides complete wafers 681, of the type partially shown in FIGS. 1A and 1B. Individual microelectronic elements or chips 682 are bonded on their active surfaces to a carrier layer or protective layer 683 by bonding apparatus 685, such as by way of a layer of adhesive, e.g., epoxy (not shown). The apparatus 685 preferably has facilities for rotation and distribution of the layer of adhesive over the non-active surface (generally the rear surface), as well of the thus formed reconstituted wafer so as to obtain even distribution of the epoxy.

The thus formed reconstituted wafer 686 is thinned at its non-active surface as by a grinding apparatus 684 using an abrasive 687. The wafer is then etched at its non-active surface, preferably by photolithography, such as by using conventional spin-coated photoresist, using a mask exposure machine 692 for the exposure of light sensitive photoresist 690 through the mask 691 and later etching the silicon in a bath 693 using solution 699. The etched wafer is bonded on the non-active side to an adhesive or protective layer 1000, which can be epoxy or other adhesive by bonding apparatus 694, which may be essentially the same as apparatus 685, to produce a doubly bonded wafer sandwich. The wafer may then by bonded to a second or more wafers.

Notching apparatus 695 partially cuts the stacked assembly in a method of forming a stacked package as described above with reference to FIGS. 2-9. The notched stacked assembly then is subjected to anti-corrosion treatment in a bath 696, containing a chromating solution 698. Alternatively, a chemical etching apparatus (not shown) may be used to form notches exposing one or more traces or openings exposing the traces of respective microelectronic elements.

Conductive layer deposition apparatus 700 (FIG. 19), which operates by vacuum deposition techniques, is employed to produce a conductive layer on one or more surfaces of each die of the wafers. Configuration of the contact strips or lead bridges is carried out preferably by using conventional electro-deposited photoresist 701. The photoresist 701 is applied to the stacked assembly 707 of reconstituted wafers in a photoresist bath assembly 702. The photoresist 701 is preferably light configured by a UV exposure system 704, which may be identical to system 692, using a mask 705 to define suitable etching patterns. The photoresist is then developed in a development bath 706, and then the wafer is etched in a metal solution 708 located in an etching bath 710, thus providing a conductor configuration.

The exposed conductive strips are then plated, preferably by electroless plating apparatus 712. The stacked wafers are then diced into individual prepackaged integrated devices as described above with reference to FIGS. 9 and 10. Preferably, the dicing blade 714 should be a diamond resinoid blade having a thickness of about 4 to about 12 mils, such thickness preferably corresponding to the width of the saw lanes 23, 25 (FIG. 1A).

While the techniques and implementations have been described with reference to exemplary embodiments, it will be understood by those skilled in the art that various changes may be made and equivalents may be substituted for elements thereof without departing from the scope of the appended claims. In addition, many modifications may be made to adapt a particular situation or material to the teachings without departing from the essential scope thereof. Therefore, the particular embodiments, implementations and techniques disclosed herein, some of which indicate the best mode contemplated for carrying out these embodiments, implementations and techniques, are not intended to limit the scope of the appended claims.

The invention claimed is:

1. A method of fabricating a stacked microelectronic assembly comprising: a) forming a structure comprising a plurality of first microelectronic elements each having a front face bonded to a carrier and a first edge surface extending away from the front face, and a plurality of first traces extending along said front face towards said first edge surface; b) removing material from said first edge surfaces to expose at least a portion of each of said first traces; c) aligning and joining a plurality of second microelectronic elements with said structure such that a front face of each said second microelectronic element is facing a rear face of a first microelectronic element, each second microelectronic element having a second edge surface and a plurality of second traces extending along said front face of said second microelectronic element towards said second edge surface; d) removing material from said second edge surfaces to expose at least a portion of each of said second traces; and e) connecting leads to said first and second traces.

2. The method of claim 1 wherein said plurality of first microelectronic elements are spaced apart from one another on said carrier; and wherein said method further comprises, after step b), forming a dielectric region between said spaced-apart first microelectronic elements of said structure.

3. The method of claim 2 further comprising forming openings in said dielectric region to expose said first and second traces and forming conductive vias in said openings in conductive communication with said first and second traces.

4. The method of claim 1 further comprising thinning said structure comprising said plurality of first microelectronic elements from said rear faces thereof.

5. A method of fabricating a stacked microelectronic assembly comprising: a) forming a structure comprising a plurality of first microelectronic elements having front faces bonded to a carrier, each first microelectronic element having a first edge and a plurality of first traces extending along said front face towards said first edge; b) removing material from said first edges to expose at least a portion of each of said first traces; c) aligning and joining a plurality of second microelectronic elements with said structure such that a front face of each said second microelectronic element is facing a rear face of a first microelectronic element, each second microelectronic element having a second edge and a plurality of second traces extending along said front face of said second microelectronic element towards said second edge; d) removing material from said second edges to expose at least a portion of each of said second traces; and e) connecting leads to said first and second traces, wherein said step e) further includes forming notches from a top surface of said stacked microelectronic assembly to a depth in said stacked microelectronic assembly sufficient to expose edges of said exposed portions of first and second traces in walls of said notches; and wherein connecting leads to said first and second traces comprises forming leads in said walls of said notches that electrically contact said exposed edges of said first and second traces.

6. The method of claim 5 wherein forming leads in said walls of said notches further comprises extending said leads from said walls to said top surface of said stacked microelectronic assembly.

7. The method of claim 5 further comprising severing said stacked microelectronic assembly into individual stacked microelectronic units each comprising at least one of each of aligned first and second microelectronic elements; wherein at least one wall of one of said notches with said leads formed thereon forms a side surface of each individual stacked microelectronic unit.

8. The method of claim 1 further comprising severing said plurality of joined first and second microelectronic elements into individual units each including first and second aligned microelectronic elements and leads extending from said first and second traces.

9. The method of claim 1 wherein said step (a) further comprises selecting individual ones of said first microelectronic elements from a plurality of unattached first microelectronic elements for bonding to said carrier.

10. The method of claim 1 wherein step c) of aligning and joining said plurality of second microelectronic elements with said structure comprises positioning each of said second microelectronic elements such that said second edge of each second microelectronic element is substantially aligned with said first edge of each said first microelectronic element.

11. The method of claim 1 wherein step c) of aligning and joining said plurality of second microelectronic elements with said structure comprises positioning each of said second microelectronic elements such that said second edge surface of each second microelectronic element is laterally offset from said first edge surface of each said first microelectronic element.

12. The method of claim 1 wherein each of said first and second microelectronic elements comprises a flash memory.

13. A method of fabricating a stacked microelectronic assembly comprising: a) forming a first structure comprising a plurality of spaced-apart first microelectronic elements each having a front face bonded to a carrier layer and an opposing rear face; each first microelectronic element comprising a plurality of first traces extending along said front face towards a first edge of said microelectronic element; b) from said rear face, removing material from said first edge of each first microelectronic element until at least a portion of each of said first traces is exposed; c) forming a dielectric layer over said plurality of spaced-apart first microelectronic elements; said dielectric layer forming a dielectric region between said spaced-apart first microelectronic elements; d) from said rear faces, thinning said dielectric layer and said plurality of spaced-apart first microelectronic elements to a desired thickness; e) forming a second structure comprising a plurality of spaced-apart second microelectronic elements by (i) aligning said plurality of spaced-apart second microelectronic elements with said plurality of spaced-apart first microelectronic elements such that a front face of each said second microelectronic element is facing a rear face of a first microelectronic element, and (ii) by joining said plurality of spaced-apart and aligned second microelectronic elements to said first structure;

each second microelectronic element having a second edge and a plurality of second traces extending along said front face of said second microelectronic element towards said second edge; f) from said rear face, removing material from said second edge of each second microelectronic element until at least a portion of each of said second traces is exposed; g) forming a dielectric layer over said plurality of spaced-apart second microelectronic elements; said dielectric layer forming a dielectric region between said spaced-apart second microelectronic elements; h) from said rear faces, thinning said dielectric layer and said plurality of spaced-apart second microelectronic elements to a desired thickness; i) forming notches from a top surface of said second structure to a depth in said stacked microelectronic assembly sufficient to expose a cross-sectional edge of each portion of said first and second traces in walls of said notches; and j) forming leads in said walls of said notches; said leads electrically connecting said exposed edges of said first and second traces; said leads extending from said walls to said top surface of said stacked microelectronic assembly.

14. The method of claim 13 wherein said step e) (i) of aligning said plurality of spaced-apart second microelectronic elements with said plurality of spaced-apart first microelectronic elements further comprises aligning said second edge of each said second microelectronic element with said first edge of each said first microelectronic element.

15. The method of claim 13 wherein said step e) (i) of aligning said plurality of spaced-apart second microelectronic elements with said plurality of spaced-apart first microelectronic elements further comprises positioning each second microelectronic element such that said second edge of each second microelectronic element is laterally offset from said first edge of each said first microelectronic element.

16. The method of claim 13 wherein each of said first and second microelectronic elements comprises a flash memory.

* * * * *